(12) United States Patent
Cho et al.

(10) Patent No.: US 9,184,220 B2
(45) Date of Patent: Nov. 10, 2015

(54) ORGANIC LIGHT-EMITTING DISPLAY APPARATUS AND METHOD OF MANUFACTURING THE SAME

(71) Applicant: Samsung Display Co., Ltd., Yongin, Gyeonggi-do (KR)

(72) Inventors: Kyu-Sik Cho, Yongin (KR); Min-Ji Baek, Yongin (KR); Dong-Rock Seo, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/453,554

(22) Filed: Aug. 6, 2014

(65) Prior Publication Data
US 2015/0228699 A1      Aug. 13, 2015

(30) Foreign Application Priority Data
Feb. 7, 2014 (KR) .......................... 10-2014-0014450

(51) Int. Cl.
*H01L 27/32* (2006.01)
*H01L 27/12* (2006.01)
*H01L 51/56* (2006.01)

(52) U.S. Cl.
CPC ........ *H01L 27/3244* (2013.01); *H01L 27/1255* (2013.01); *H01L 27/1259* (2013.01); *H01L 27/3223* (2013.01); *H01L 27/3265* (2013.01); *H01L 27/3279* (2013.01); *H01L 51/56* (2013.01); *H01L 2227/323* (2013.01)

(58) Field of Classification Search
CPC . H01L 27/3244; H01L 27/3223; H01L 27/32; H01L 27/3241; H01L 27/3265; H01L 27/3279; H01L 27/1259; H01L 27/1255; H01L 51/56; H01L 2227/323
USPC .............................. 445/24–25; 313/498–512
See application file for complete search history.

(56) References Cited

U.S. PATENT DOCUMENTS

| 8,698,145 | B2 | 4/2014 | Kim |
| 2010/0181572 | A1 | 7/2010 | Lee et al. |
| 2013/0134424 | A1 | 5/2013 | Kim et al. |
| 2014/0027720 | A1* | 1/2014 | Kim et al. .................. 257/40 |

(Continued)

FOREIGN PATENT DOCUMENTS

| KR | 2000-0025568 A | 5/2000 |
| KR | 10-2004-0032602 A | 4/2004 |
| KR | 10-2007-0038345 A | 4/2007 |

(Continued)

*Primary Examiner* — Anne Hines
*Assistant Examiner* — Jose M Diaz
(74) *Attorney, Agent, or Firm* — Christie, Parker & Hale, LLP

(57) ABSTRACT

An organic light-emitting display apparatus includes: a substrate; a thin film transistor (TFT) on the substrate and including an active layer, a gate electrode overlapping a gate region of the active layer, a source electrode overlapping a source region of the active layer, and a drain electrode overlapping a drain region of the active layer; a first electrode electrically connected to one of the source electrode or the drain electrode; a first dummy conductive pattern overlapping a dummy region of the active layer between the gate region and one of the source region or the drain region corresponding to the one of the source electrode or the drain electrode; an intermediate layer on the first electrode and comprising at least an organic emission layer; and a second electrode on the intermediate layer.

20 Claims, 13 Drawing Sheets

(56) References Cited

U.S. PATENT DOCUMENTS

2015/0041818 A1* 2/2015 Tanaka et al. .................. 257/72
2015/0138171 A1* 5/2015 Kim et al. .................... 345/205

FOREIGN PATENT DOCUMENTS

| | | |
|---|---|---|
| KR | 10-2012-0032905 A | 4/2012 |
| KR | 10-2013-0060915 A | 6/2013 |

* cited by examiner

ORGANIC LIGHT-EMITTING DISPLAY APPARATUS AND METHOD OF MANUFACTURING THE SAME

CROSS-REFERENCE TO RELATED APPLICATION

This application claims priority to and the benefit of Korean Patent Application No. 10-2014-0014450, filed on Feb. 7, 2014 in the Korean Intellectual Property Office, the entire content of which is incorporated herein by reference.

BACKGROUND

1. Field

Aspects of one or more embodiments of the present invention relate to an organic light-emitting display apparatus and a method of manufacturing the organic light-emitting display apparatus.

2. Description of the Related Art

Recently, display apparatuses have been used in diverse fields. Particularly, display apparatuses have been made thin and light, and thus, the scope of using display apparatuses has become even wider. Among the display apparatuses, organic light-emitting display apparatuses, which are self-emitting type display apparatuses, have excellent characteristics in power consumption and image quality, and thus, significant amounts of research has been conducted into organic light-emitting display apparatuses.

An organic light-emitting display apparatus may include a first electrode, a second electrode opposing the first electrode, and an organic emission layer disposed between the first and second electrodes. The organic emission layer emits visible light by recombination of holes and electrons when voltages are applied to the first and second electrodes. An organic light-emitting display apparatus may include various members to drive the first electrode, the second electrode, and the organic emission layer, and thus, electrical characteristics of such various members affect electrical characteristics and image quality of the organic light-emitting display apparatus.

SUMMARY

Aspects of one or more embodiments of the present invention are directed toward an organic light-emitting display apparatus and a method of manufacturing the organic light-emitting display apparatus. Additional aspects will be set forth in part in the description that follows and, in part, will be apparent from the description, or may be learned by practice of the presented embodiments.

According to an embodiment of the present invention, an organic light-emitting display apparatus is provided. The organic light-emitting display apparatus includes: a substrate; a thin film transistor (TFT) on the substrate and including an active layer, a gate electrode overlapping a gate region of the active layer, a source electrode overlapping a source region of the active layer, and a drain electrode overlapping a drain region of the active layer; a first electrode electrically connected to one of the source electrode or the drain electrode; a first dummy conductive pattern overlapping a dummy region of the active layer between the gate region and one of the source region or the drain region corresponding to the one of the source electrode or the drain electrode; an intermediate layer on the first electrode and including at least an organic emission layer; and a second electrode on the intermediate layer.

The first dummy conductive pattern and the dummy region may form a dummy capacitor.

The first dummy conductive pattern may be separated from the gate electrode.

The first dummy conductive pattern may be separated from the source electrode and the drain electrode.

The first dummy conductive pattern may not overlap the source electrode or the drain electrode.

The first dummy conductive pattern may be an island pattern.

The first electrode may include a same material and be in a same layer as the gate electrode.

The organic light-emitting display apparatus may further include a gate insulating layer between the active layer and the gate electrode. The first electrode may be on the gate insulating layer.

The organic light-emitting display apparatus may further include a storage capacitor electrically connected to the TFT. The first dummy conductive pattern may include a same material and be in a same layer as a first terminal of the storage capacitor.

The active layer may include a same material and be in a same layer as a second terminal of the storage capacitor.

The organic light-emitting display apparatus may further include a second dummy conductive pattern overlapping the first dummy conductive pattern.

The second dummy conductive pattern may be separated from the source electrode and the drain electrode.

The second dummy conductive pattern may be an island pattern.

The second dummy conductive pattern may include a same material and be in a same layer as the source electrode or the drain electrode.

The first dummy conductive pattern may include a light-transmitting conductive material.

According to another embodiment of the present invention, a method of manufacturing an organic light-emitting display apparatus is provided. The method includes: forming a thin film transistor (TFT) including an active layer, a gate electrode overlapping a gate region of the active layer, a source electrode overlapping a source region of the active layer, and a drain electrode overlapping a drain region of the active layer on a substrate; forming a first electrode electrically connected to one of the source electrode or the drain electrode; forming a first dummy conductive pattern overlapping a dummy region of the active layer between the gate region and one of the source region or the drain region corresponding to the one of the source electrode or the drain electrode; forming an intermediate layer on the first electrode and including at least an organic emission layer; and forming a second electrode on the intermediate layer.

The method may further include forming a storage capacitor electrically connected to the TFT. The first dummy conductive pattern may include a same material and be in a same layer as a terminal of the storage capacitor.

The method may further include forming a second dummy conductive pattern overlapping the first dummy conductive pattern.

The second dummy conductive pattern may include a same material and be in a same layer as the source electrode or the drain electrode.

The second dummy conductive pattern may be separated from the source electrode and the drain electrode.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
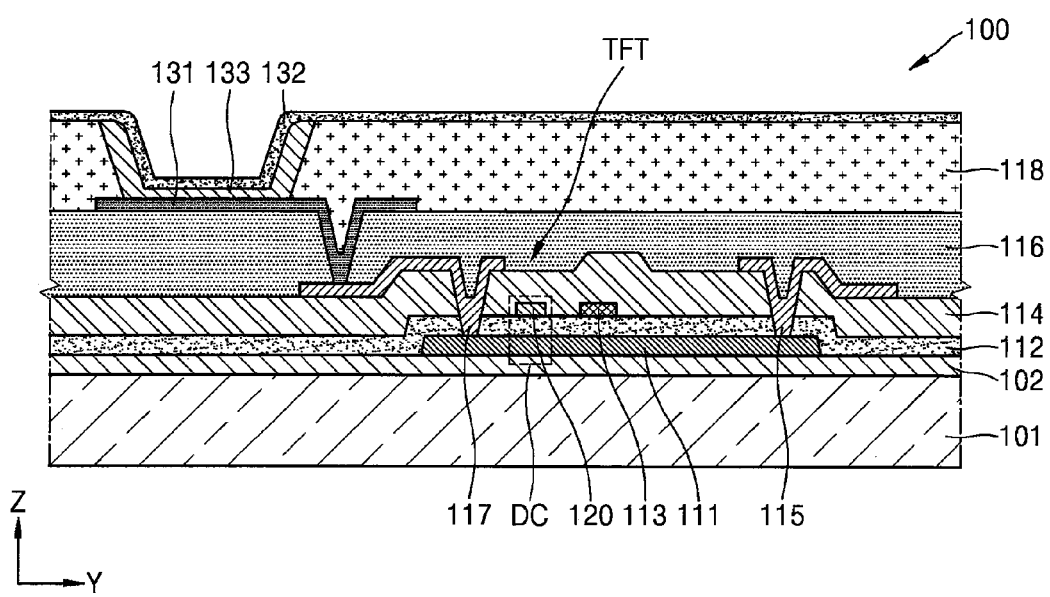
FIG. 1 is a cross-sectional view of an organic light-emitting display apparatus according to an embodiment of the present invention.

Reference will now be made in detail to example embodiments, which are illustrated in the accompanying drawings, wherein like reference numerals refer to like elements throughout. In this regard, embodiments of the present invention may have different forms and should not be construed as being limited to the descriptions set forth herein. Accordingly, the embodiments are merely described below, by referring to the figures, to explain aspects of the present invention. Expressions such as "at least one of," when preceding a list of elements, modify the entire list of elements and do not modify the individual elements of the list.

It will be understood that although the terms "first," "second," etc., may be used herein to describe various components, these components should not be limited by these terms. These components are only used to distinguish one component from another. As used herein, the singular forms "a," "an," and "the" are intended to include the plural forms as well, unless the context clearly indicates otherwise.

It will be understood that the terms "comprises" and/or "comprising" used herein specify the presence of stated features or components, but do not preclude the presence or addition of one or more other features or components. It will be further understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings may be arbitrarily illustrated for convenience of explanation, the described embodiments are not limited thereto.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When an embodiment may be implemented differently, a specific step or process order may be performed differently from the described order. For example, when possible to achieve the desired results, two consecutively described steps or processes may be performed substantially at the same time or performed in an order opposite to the described order.

Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed.

Figure 2:
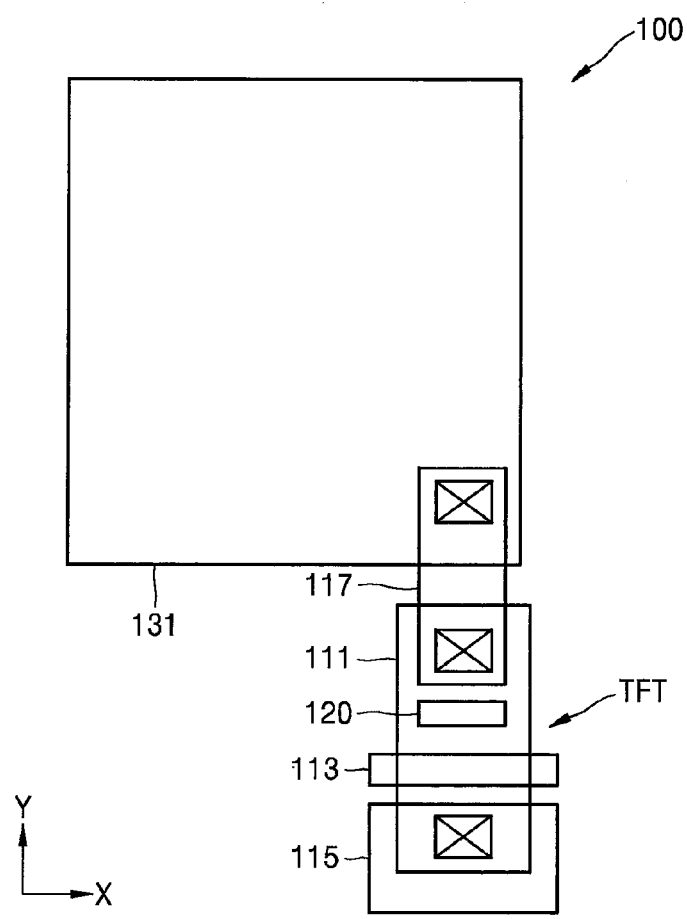
FIG. 2 is a plan view of a structure of the organic light-emitting display apparatus of FIG. 1.

FIG. 1 is a cross-sectional view of an organic light-emitting display apparatus 100 according to an embodiment of the present invention. FIG. 2 is a plan view of a structure of the organic light-emitting display apparatus 100 of FIG. 1.

Referring to FIG. 1 and FIG. 2, the organic light-emitting display apparatus 100 includes a substrate 101, a thin film transistor (TFT, such as a driving transistor), a dummy conductive pattern 120, a first electrode 131, a second electrode 132, and an intermediate layer 133. The TFT includes an active layer 111, a gate electrode 113, a source electrode 115, and a drain electrode 117. The intermediate layer 133 includes at least an organic emission layer to emit visible light.

For ease of description, in the embodiments described herein, the drain electrode 117 is connected to the first electrode 131. However, the present invention is not limited thereto, and in other embodiments, the source electrode 115 may be connected to the first electrode 131, with the corresponding roles for the source electrode 115 and drain electrode 117 switched from those described herein.

The substrate 101 may be formed of a glass material including $SiO_2$. However, the substrate 101 is not limited thereto, and in other embodiments, may be formed of a plastic material. Here, the plastic material forming the substrate 101 may be at least one selected from various organic materials. In addition, the substrate 101 may be formed of metal, such as a metal thin film, according to other embodiments of the present invention.

A buffer layer 102 may be formed on the substrate 101. The buffer layer 102 reduces or prevents penetration of impure elements through the substrate 101 and provides a flat upper surface of the substrate 101. The buffer layer 102 may be formed of various materials that may be used to perform this function. Since the buffer layer 102 may be optionally formed, the buffer layer 102 may be omitted in other embodiments.

The active layer 111 is disposed on the buffer layer 102 in a set or predetermined pattern. The active layer 111 may be formed, for example, of an inorganic semiconductor material, such as silicon, or may be formed of an organic semiconductor material according to another embodiment of the present invention, or may be formed of an oxide semiconductor material according to yet another embodiment of the present invention.

A gate insulating layer 112 is formed above (such as on) the active layer 111. The gate insulating layer 112 may be formed of various insulating materials. For example, the gate insulating layer 112 may be formed of oxide or nitride.

The gate electrode 113 is formed on the gate insulating layer 112 to correspond to a set or predetermined region (such as a channel region or gate region) of the active layer 111. The gate electrode 113 may be formed of a highly conductive material (such as metal). For example, the gate electrode 113 may contain gold (Au), silver (Ag), copper (Cu), nickel (Ni), platinum (Pt), palladium (Pd), aluminum (Al), or molybdenum (Mo), or may contain an alloy, such as Al: neodymium (Nd) or Mo: tungsten (W). However, the gate electrode 113 is not limited thereto and, in other embodiments, may be formed of various materials as known by someone of skill in the art.

The dummy conductive patter 120 is formed on the gate insulating layer 112. The dummy conductive pattern 120 overlaps a set or predetermined region (such as a dummy region) of the active layer 111. In further detail, the dummy conductive pattern 120 is formed such that the dummy region of the active layer 111 is between the gate region of the active layer 111 (which overlaps with the gate electrode 113) and a drain region of the active layer 111, which is electrically connected to the drain electrode 117 (that is electrically connected to the first electrode 131). In other embodiments, when the source electrode 115 is electrically connected to the first electrode 131, the dummy region is between the gate region and the source region of the active layer 111.

The dummy conductive pattern 120 and the dummy region of the active layer 111 (which overlaps with the dummy conductive pattern 120) form a dummy capacitor DC. In addition, the dummy conductive pattern 120 is separated from the gate electrode 113, the source electrode 115, and the drain electrode 117. Further, the dummy conductive pattern 120 does not overlap the source electrode 115 or the drain electrode 117.

The dummy conductive pattern 120 is not connected to other electrically conductive members. In particular, the dummy conductive pattern 120 is not connected to the gate electrode 113, the source electrode 115, or the drain electrode 117. The dummy conductive pattern 120 may be formed in an island pattern.

The dummy conductive pattern 120 may contain various (electrically) conductive materials. For example, the dummy conductive pattern 120 may contain a light-transmitting conductive material. An interlayer insulating layer 114 is formed on and covers the gate electrode 113 and the dummy conductive pattern 120.

The source electrode 115 and the drain electrode 117 are formed on the interlayer insulating layer 114. The source electrode 115 and the drain electrode 117 contact set or predetermined regions (such as a source region and a drain region, respectively) of the active layer 111. The source electrode 115 and the drain electrode 117 are not connected to the dummy conductive pattern 120. In addition, the source electrode 115 and the drain electrode 117 do not overlap the dummy conductive pattern 120.

A passivation layer 116 is formed on and covers the source electrode 115 and the drain electrode 117. The passivation layer 116 may planarize the TFT. In another embodiment, an additional insulating layer may further be formed above the passivation layer 116 to planarize the TFT.

For convenience of explanation, FIG. 2 illustrates only a schematic structure of the organic light-emitting display apparatus 100 of FIG. 1. However, the present invention is not limited to the embodiment illustrated in FIG. 2. In other embodiments, the organic light-emitting display apparatus 100 may further include at least one additional transistor (such as a switching transistor) and at least one additional capacitor (such as a storage capacitor).

The first electrode 131 is formed on the passivation layer 116. The first electrode 131 is electrically connected to the drain electrode 117. In other embodiments, the first electrode 131 may be connected to the source electrode 115. A pixel-defining layer 118 is formed on the first electrode 131, and a set or predetermined region of the first electrode 131 is exposed (e.g., by patterning) through the pixel-defining layer 118.

The intermediate layer 133 is formed on the first electrode 131. The intermediate layer 133 includes an organic emission layer. According to another embodiment of the present invention, the intermediate layer 133 may further include at least one of a hole injection layer, a hole transport layer, an electron transport layer, and an electron injection layer, in addition to the organic emission layer. The second electrode 132 is formed on the intermediate layer 133.

The organic light-emitting display apparatus 100 includes the dummy conductive pattern 120. The dummy conductive pattern 120 overlaps the dummy region of the active layer 111, thereby forming the dummy capacitor DC.

The dummy conductive pattern 120 in FIG. 1 is formed such that the dummy region is between the gate region and the drain region of the active layer 111, while the drain electrode 117 is electrically connected to the first electrode 131. Accordingly, when an influx of external static electricity enters through the first electrode 131 of the organic light-emitting display apparatus 100, the TFT (such as the driving transistor) may be prevented from being damaged by the static electricity because the external static electricity does not flow to the TFT. Rather, the static electricity flows through the first electrode 131 to the drain electrode 117, and is then stored in the dummy capacitor DC. Depending on factors such as the intensity of the static electricity, the dummy capacitor DC may be damaged by the static electricity, but the static electricity is prevented from flowing to the TFT.

Consequently, damage to the TFT of the organic light-emitting display apparatus 100 is reduced or prevented. Thus, electrical characteristics of the organic light-emitting display apparatus 100 are improved and defects of the organic light-emitting display apparatus 100 are suppressed, which leads to an improvement in image quality thereof.

Here, when the dummy conductive pattern 120 is formed, the dummy conductive pattern 120 is spaced apart from the gate electrode 113, is not connected to the source electrode 115 or the drain electrode 117, and is formed in an island pattern. Accordingly, the dummy conductive pattern 120 and the dummy capacitor DC (which includes the dummy conductive pattern 120) are prevented from electrically affecting (or having a significant electrical effect on) the TFT. In addition, the dummy conductive pattern 120 does not overlap the source electrode 115 or the drain electrode 117, which reduces or prevents parasitic capacitance that may occur between the dummy conductive pattern 120 and the source or drain electrodes 115 or 117.

Figure 3:
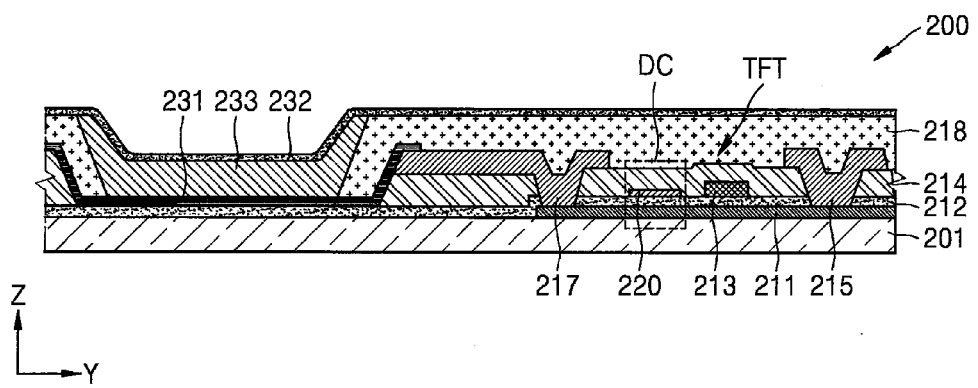
FIG. 3 is a cross-sectional view of an organic light-emitting display apparatus according to another embodiment of the present invention.
Figure 4:
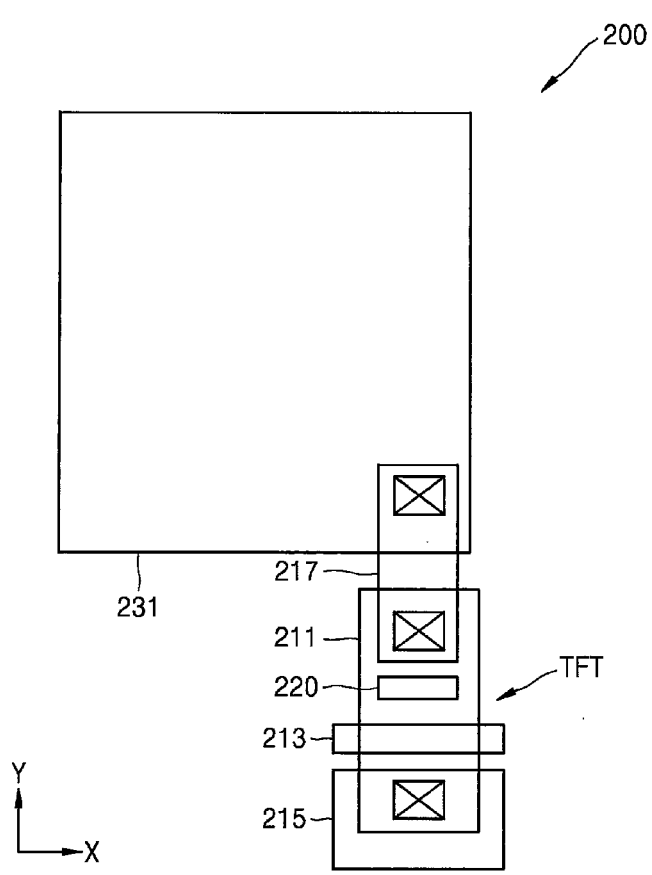
FIG. 4 is a plan view of an example structure of the organic light-emitting display apparatus of FIG. 3.
Figure 5:
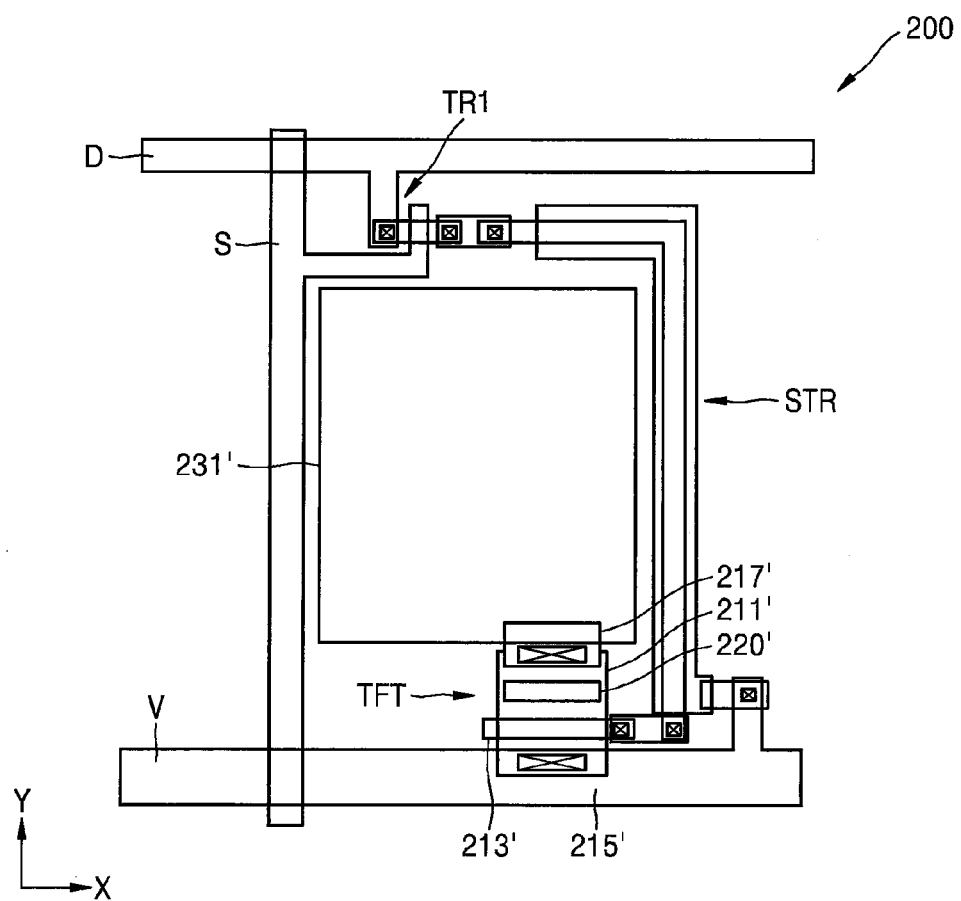
FIG. 5 is a plan view of another example structure of the organic light-emitting display apparatus of FIG. 3.

FIG. 3 is a cross-sectional view of an organic light-emitting display apparatus 200 according to another embodiment of the present invention. FIG. 4 is a plan view of an example structure of the organic light-emitting display apparatus 200 of FIG. 3. FIG. 5 is a plan view of another example structure of the organic light-emitting display apparatus 200 of FIG. 3.

Referring to FIGS. 3 and 4, the organic light-emitting display apparatus 200 includes a substrate 201, a TFT, a dummy conductive pattern 220, a first electrode 231, a second electrode 232, and an intermediate layer 233. The TFT includes an active layer 211, a gate electrode 213, a source electrode 215, and a drain electrode 217. The intermediate layer 233 includes at least an organic emission layer to emit visible light.

For convenience of explanation, descriptions will be provided focusing on different aspects from the aspects of the above-described embodiment of FIGS. 1 and 2. A buffer layer may be formed on the substrate 201 according to another embodiment of the present invention.

The active layer 211 is formed on the substrate 201 in a set or predetermined pattern. A gate insulating layer 212 is formed above the active layer 211. The gate electrode 213 is formed on the gate insulating layer 212 to correspond to a set or predetermined region (such as a gate region) of the active layer 211.

The dummy conductive pattern 220 is formed on the gate insulating layer 212. The dummy conductive pattern 220 overlaps a set or predetermined region (such as a dummy region) of the active layer 211. In further detail, the dummy conductive pattern 220 is formed such that the dummy region of the active layer 211 is between the gate region of the active layer 211 (which overlaps with the gate electrode 213) and a drain region of the active layer 211, which is electrically connected to the drain electrode 217 (that is electrically connected to the first electrode 231). In other embodiments, when the source electrode 215 is electrically connected to the first electrode 231, the dummy region is between the gate region and the source region of the active layer 211.

The dummy conductive pattern 220 and the dummy region of the active layer 211 (which overlaps with the dummy conductive pattern 220) form a dummy capacitor DC. In addition, the dummy conductive patter 220 is separated from the gate electrode 213, the source electrode 215, and the drain electrode 217. Further, the dummy conductive pattern 220 does not overlap the source electrode 215 or the drain electrode 217.

The dummy conductive pattern 220 is not connected to other electrically conductive members. In particular, the dummy conductive pattern 220 is not connected to the gate electrode 213, the source electrode 215, or the drain electrode 217. The dummy conductive pattern 220 may be formed in an island pattern. An interlayer insulating layer 214 is formed on and covers the gate electrode 213 and the dummy conductive pattern 220.

The source electrode 215 and the drain electrode 217 are formed on the interlayer insulating layer 214. The source electrode 215 and the drain electrode 217 contact set or predetermined regions (such as a source region and a drain region, respectively) of the active layer 211. The source electrode 215 and the drain electrode 217 are not connected to the dummy conductive pattern 220. In addition, the source electrode 215 and the drain electrode 217 do not overlap the dummy conductive pattern 220. A passivation layer or a planarization layer may further be formed on and cover the source electrode 215 and the drain electrode 217.

The first electrode 231 is electrically connected to the drain electrode 217. In other embodiments, the first electrode 231 may be connected to the source electrode 215. Here, the first electrode 231 may be formed on (such as directly on) the gate insulating layer 212. To this end, the interlayer insulating layer 214 may be formed to have a set or predetermined pattern or opening (exposing the gate insulating layer 212) for a region in which the first electrode 231 is formed. A pixel-defining layer 218 is formed on the first electrode 231, and a set or predetermined region of the first electrode 231 is exposed (e.g., by patterning) through the pixel-defining layer 218.

The intermediate layer 233 is formed on the first electrode 231. The intermediate layer 233 includes an organic emission layer. According to another embodiment of the present invention, the intermediate layer 233 may further include at least one of a hole injection layer, a hole transport layer, an electron transport layer, and an electron injection layer, in addition to the organic emission layer. The second electrode 232 is formed on the intermediate layer 233.

The organic light-emitting display apparatus 200 includes the dummy conductive pattern 220. The dummy conductive pattern 220 overlaps the set or predetermined region of the active layer 211, thereby forming the dummy capacitor DC.

The dummy conductive pattern 220 in FIG. 3 is formed such that the dummy region is between the gate region and the drain region of the active layer 211, while the drain electrode 217 is electrically connected to the first electrode 231. Accordingly, when an influx of external static electricity enters through the first electrode 231 of the organic light-emitting display apparatus 200, the TFT (such as the driving transistor) may be prevented from being damaged by the static electricity because the external static electricity does not flow to the TFT. Rather, the static electricity flows through the first electrode 231 to the drain electrode 217, and is then stored in the dummy capacitor DC. Depending on factors such as the intensity of the static electricity, only the dummy capacitor DC may be damaged by the static electricity.

In the organic light-emitting display apparatus 200, the first electrode 231 is disposed close to the substrate 201, and thus, static electricity may easily flow to the first electrode 231. However, damage to the TFT of the organic light-emitting display apparatus 200 is reduced or prevented by the dummy capacitor DC. Accordingly, electrical characteristics of the organic light-emitting display apparatus 200 are improved and image quality of the organic light-emitting display apparatus 200 is improved by suppressing defects of the organic light-emitting display apparatus 200.

Here, when the dummy conductive pattern 220 is formed, the dummy conductive pattern 220 is spaced apart from the gate electrode 213, is not connected to the source electrode 215 or the drain electrode 217, and is formed in an island pattern. Accordingly, the dummy conductive pattern 220 and the dummy capacitor DC (which includes the dummy conductive pattern 220) are prevented from electrically affecting (or having a significant electrical effect on) the TFT.

In addition, the dummy conductive pattern 220 does not overlap the source electrode 215 or the drain electrode 217, which reduces or prevents parasitic capacitance from occurring between the dummy conductive pattern 220 and the source or drain electrodes 215 or 217.

The organic light-emitting display apparatus 200 may further include at least one additional transistor and at least one additional capacitor. For example, the organic light-emitting display apparatus 200 may have a flat structure as illustrated in FIG. 5. That is, as illustrated in FIG. 5, the organic light-emitting display apparatus 200 may include an additional transistor TR1 and a storage capacitor STR.

Referring to FIG. 5, the TFT includes an active layer 211', a gate electrode 213', a source electrode 215', and a drain electrode 217'. This is similar to the above-described embodiments, and thus, description will focus on different aspects. In addition, the structure of a dummy conductive pattern 220' is similar to the above-described embodiments, and thus, duplicate description thereof may not be repeated.

The additional transistor TR1 (for example, a switching transistor) is electrically connected to a scan line S and a data line D. The storage capacitor STR is formed of various materials. For example, the storage capacitor STR may include a first terminal formed in the same layer and of the same material as the active layer 211', and a second terminal formed in the same layer and of the same material as the dummy conductive pattern 220'. The additional transistor TR1 may be electrically connected to the storage capacitor STR when a voltage is applied to the scan line S so that a voltage applied the data line D is transmitted to the storage capacitor STR. The storage capacitor STR may be electrically connected to the gate electrode 213' of the TFT, and the source electrode 215' may be connected to a power supply line V.

For example, the TFT may be a driving transistor, and the additional transistor TR1 may be a switching transistor. However, this is only an example embodiment of the present invention. Other embodiments of the present invention are not limited thereto, and may include various numbers of additional TFTs of various structures, including various functions and locations, and may further include various numbers of capacitors in addition to the storage capacitor STR.

As illustrated in FIG. 5, the organic light-emitting display apparatus 200 may include members, such as the additional transistor TR1 and the storage capacitor STR. Without the dummy conductive pattern 220', when an influx of external static electricity enters through a first electrode 231' of the organic light-emitting display apparatus 200, the static electricity may flow to the additional transistor TR1 and to the storage capacitor STR through the TFT, thereby causing damage to the TFT, the additional transistor TR1, and the storage capacitor STR. According to the embodiment of FIG. 5, damage to the TFT is reduced or prevented by the dummy capacitor DC, and damage to the additional transistor TR1 and the storage capacitor STR is reduced or prevented.

Figure 6:
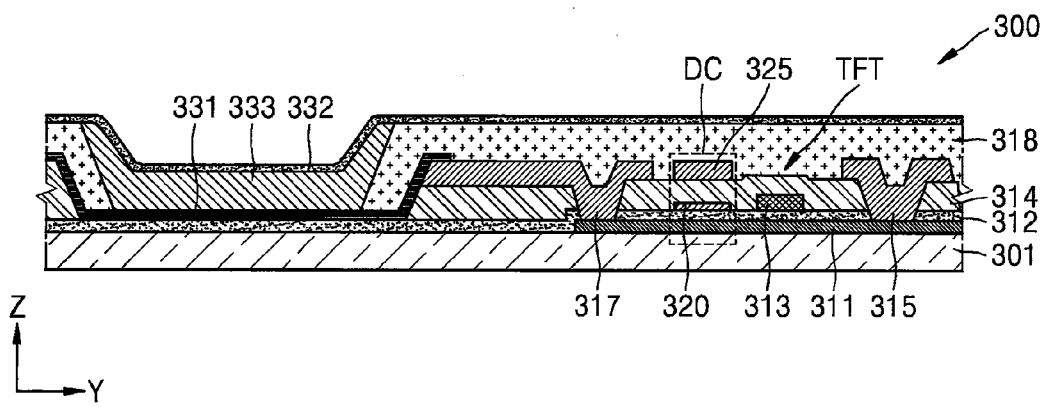
FIG. 6 is a cross-sectional view of an organic light-emitting display apparatus according to yet another embodiment of the present invention.
Figure 7:
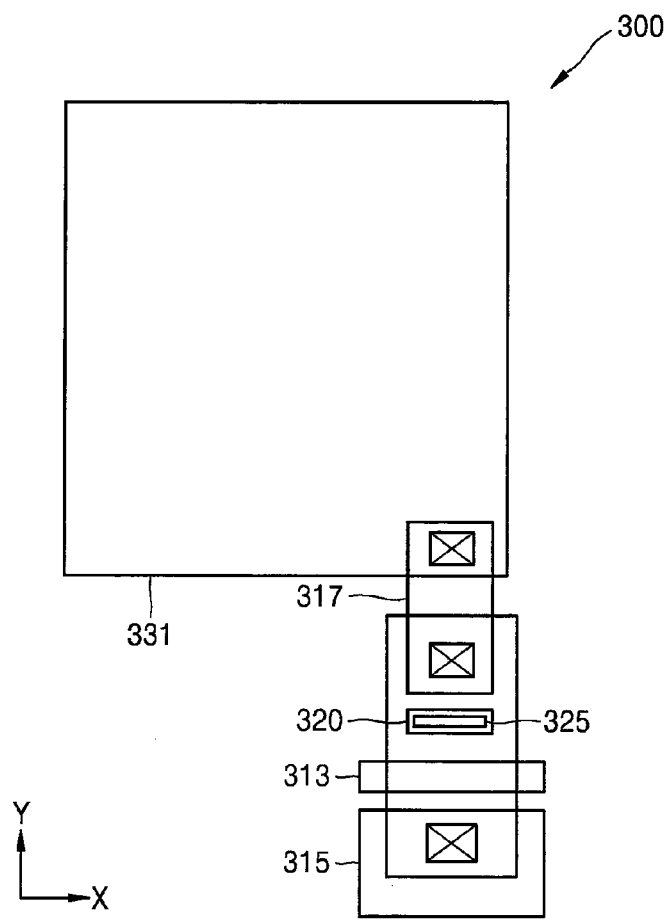
FIG. 7 is a plan view of an example structure of the organic light-emitting display apparatus of FIG. 6.
Figure 8:
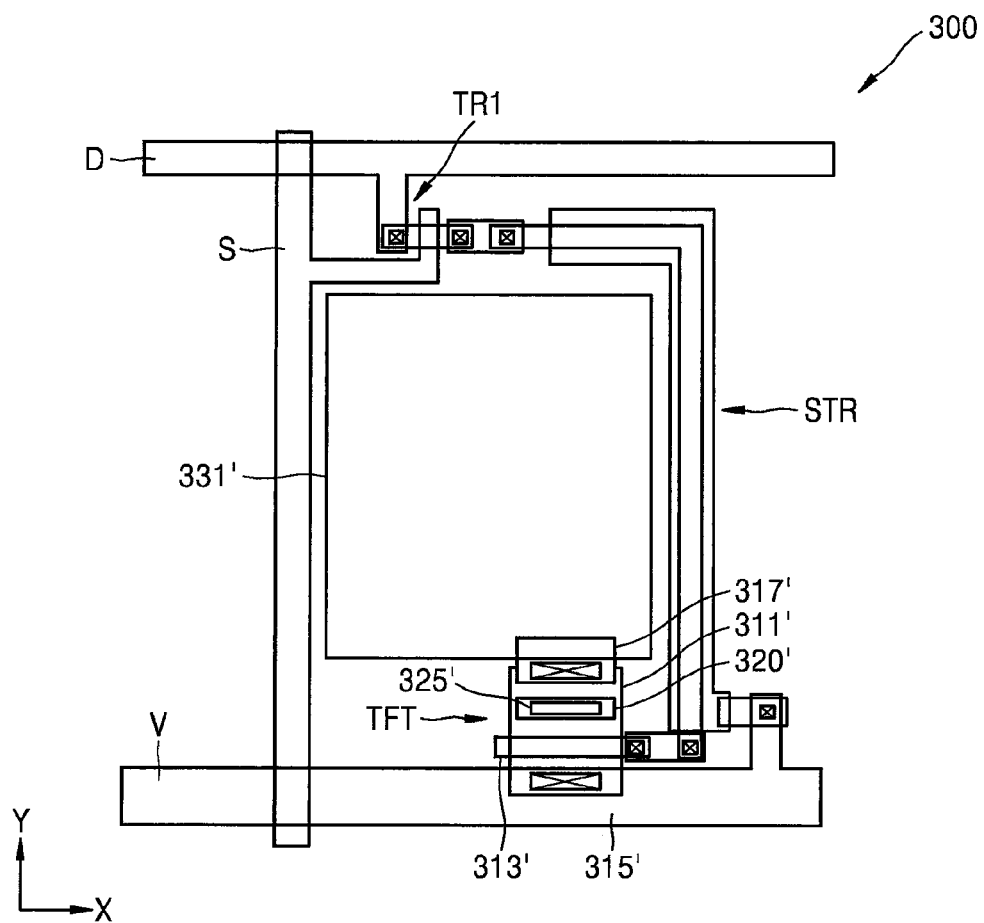
FIG. 8 is a plan view of another example structure of the organic light-emitting display apparatus of FIG. 6.

FIG. 6 is a cross-sectional view of an organic light-emitting display apparatus 300 according to yet another embodiment of the present invention. FIG. 7 is a plan view of an example structure of the organic light-emitting display apparatus 300 of FIG. 6. FIG. 8 is a plan view of another example structure of the organic light-emitting display apparatus 300 of FIG. 6.

Referring to FIGS. 6 and 7, the organic light-emitting display apparatus 300 includes a substrate 301, a TFT, a dummy conductive pattern 320, an upper dummy conductive pattern 325, a first electrode 331, a second electrode 332, and an intermediate layer 333. The TFT includes an active layer 311, a gate electrode 313, a source electrode 315, and a drain electrode 317. The intermediate layer 333 includes at least an organic emission layer to emit visible light.

For convenience of explanation, descriptions will be provided focusing on different aspects from the aspects of the above-described embodiments. A buffer layer may be formed on the substrate 301 according to another embodiment of the present invention.

The active layer 311 is formed on the substrate 301 in a set or predetermined pattern. A gate insulating layer 312 is formed above the active layer 311. The gate electrode 313 is formed on the gate insulating layer 312 to correspond to a set or predetermined region (such as a gate region) of the active layer 311.

The dummy conductive pattern 320 is formed on the gate insulating layer 312. The dummy conductive pattern 320 overlaps a set or predetermined region (such as a dummy region) of the active layer 311. In further detail, the dummy conductive pattern 320 is formed such that the dummy region of the active layer 211 is between the gate region of the active layer 311 (which overlaps with the gate electrode 313) and a drain region of the active layer 311, which is electrically connected to the drain electrode 317 (that is electrically connected to the first electrode 331). In other embodiments, when the source electrode 315 is electrically connected to the first electrode 331, the dummy region is between the gate region and the source region of the active layer 311.

The dummy conductive pattern 320 is separated from the gate electrode 313, the source electrode 315, and the drain electrode 317. In addition, the dummy conductive pattern 320 does not overlap the source electrode 315 or the drain electrode 317.

The dummy conductive pattern 320 is not connected to other electrically conductive members. In particular, the dummy conductive pattern 320 is not connected to the gate electrode 313, the source electrode 315, or the drain electrode 317. The dummy conductive pattern 320 may be formed in an island pattern. An interlayer insulating layer 314 is formed on and covers the gate electrode 313 and the dummy conductive pattern 320.

The source electrode 315 and the drain electrode 317 are formed on the interlayer insulating layer 314. The source electrode 315 and the drain electrode 317 contact set or predetermined regions (such as a source region and a drain region, respectively) of the active layer 311. The source electrode 315 and the drain electrode 317 are not connected to the dummy conductive pattern 320. In addition, the source electrode 315 and the drain electrode 317 do not overlap the dummy conductive pattern 320.

The upper dummy conductive pattern 325 is formed on the interlayer insulating layer 314. The upper dummy conductive pattern 325 overlaps the dummy conductive pattern 320. The upper dummy conductive pattern 325 is not connected to the source electrode 315 or the drain electrode 317. The upper dummy conductive pattern 325 may be formed in an island pattern. The upper dummy conductive pattern 325 may be formed in the same layer and of the same material as the source electrode 315 and the drain electrode 317.

The dummy conductive pattern 320 and the dummy region of the active layer 311 (which overlaps with the dummy conductive pattern 320) form a lower capacitor of a dummy capacitor DC. In addition, the dummy conductive pattern 320 and the upper dummy conductive pattern 325 overlapping the dummy conductive pattern 320 form an upper capacitor of the dummy capacitor DC.

The first electrode 331 is electrically connected to the drain electrode 317. In other embodiments, the first electrode 331 may be connected to the source electrode 315. Here, the first electrode 331 may be formed on (such as directly on) the gate insulating layer 312. To this end, the interlayer insulating layer 314 may be formed to have a set or predetermined pattern or opening (exposing the gate insulating layer 312) for a region in which the first electrode 331 is formed. A pixel-defining layer 318 is formed on the first electrode 331, and a set or predetermined region of the first electrode 331 is exposed (e.g., by patterning) through the pixel-defining layer 218.

The intermediate layer 333 is formed on the first electrode 331. The intermediate layer 333 includes an organic emission layer. According to another embodiment of the present invention, the intermediate layer 333 may further include at least one of a hole injection layer, a hole transport layer, an electron transport layer, and an electron injection layer, in addition to the organic emission layer. The second electrode 332 is formed on the intermediate layer 333.

The organic light-emitting display apparatus 300 includes the dummy conductive pattern 320 and the upper dummy conductive pattern 325. A lower capacitor formed by the dummy conductive pattern 320 and a set or predetermined region (the dummy region) of the active layer 311 overlapping each other, and an upper capacitor formed by the dummy conductive pattern 320 and the upper dummy conductive pattern 325 overlapping each other, share the dummy conductive pattern 320, and collectively form the dummy capacitor DC.

Accordingly, when an influx of external static electricity enters through the first electrode 331 of the organic light-emitting display apparatus 300, the TFT (such as the driving transistor) may be prevented from being damaged by the static electricity because the external static electricity does not flow to the TFT. Rather, the static electricity flows through the first electrode 331 to the drain electrode 317, and the static electricity is stored in the dummy capacitor DC. Depending on factors such as the intensity of the static electricity, only the dummy capacitor DC may be damaged by the static electricity.

In the organic light-emitting display apparatus 300, the first electrode 331 is disposed close to the substrate 301, and thus, static electricity may easily flow to the first electrode 331. However, damage to the TFT of the organic light-emitting display apparatus 300 is reduced or prevented by the dummy capacitor DC. Accordingly, electrical characteristics of the organic light-emitting display apparatus 300 are improved and defects of the organic light-emitting display apparatus 300 are suppressed, which lead to an improvement in image quality thereof.

Here, when the dummy conductive pattern 320 and the upper dummy conductive pattern 325 are formed, the dummy conductive pattern 320 and the upper dummy conductive pattern 325 are spaced apart from the gate electrode 313, are not connected to the source electrode 315 or the drain electrode 317, and are formed in island patterns. Accordingly, the dummy conductive pattern 320, the upper dummy conductive pattern 325, and the dummy capacitor DC (which includes the dummy conductive pattern 320 and the upper dummy conductive pattern 325), are prevented from electrically affecting (or having a significant electrical effect on) the TFT.

In addition, the dummy conductive pattern 320 does not overlap the source electrode 315 or the drain electrode 317 so that parasitic capacitance that may occur between the dummy conductive pattern 320 and the source or drain electrodes 315 or 317 is reduced or prevented.

The organic light-emitting display apparatus 300 may further include at least one additional transistor and at least one additional capacitor. For example, the organic light-emitting display apparatus 300 may have a flat structure as illustrated in FIG. 8. That is, as illustrated in FIG. 8, the organic light-emitting display apparatus 300 may include an additional transistor TR1 and a storage capacitor STR.

Referring to FIG. 8, the TFT includes an active layer 311', a gate electrode 313', a source electrode 315', and a drain electrode 317'. This is similar to the above-described embodiments, and thus, description will focus on different aspects. In addition, structures of the dummy conductive pattern 320' and the upper dummy conductive pattern 325' are similar to the above-described embodiments, and thus, duplicate description thereof may not be repeated.

The additional transistor TR1 (for example, a switching transistor) is electrically connected to a scan line S and a data line D. The storage capacitor STR is formed of various materials. For example, the storage capacitor STR may include a first terminal formed in the same layer and of the same material as the active layer 311', and a second terminal formed in the same layer and of the same material as the dummy conductive pattern 320'.

The additional transistor TR1 may be electrically connected to the storage capacitor STR when a voltage is applied to the scan line S so that a voltage applied the data line D is transmitted to the storage capacitor STR. The storage capacitor STR may be electrically connected to the gate electrode 313' of the TFT, and the source electrode 315' may be connected to a power supply line V.

For example, the TFT may be a driving transistor, and the additional transistor TR1 may be a switching transistor. However, this is only an example embodiment of the present invention. Other embodiments of the present invention are not limited thereto, and may include various numbers of additional TFTs of various structures, including various functions and locations, and may further include various numbers of capacitors in addition to the storage capacitor STR.

As illustrated in FIG. 8, the organic light-emitting display apparatus 300 may include members, such as the additional transistor TR1 and the storage capacitor STR. Without the dummy conductive pattern 320' and upper dummy conductive pattern 325', when an influx of external static electricity enters through the first electrode 331' of the organic light-emitting display apparatus 300, the static electricity may flow to the additional transistor TR1 and to the storage capacitor STR through the TFT, thereby causing damage to the TFT, the additional transistor TR1, and the storage capacitor STR. According to the embodiment of FIG. 8, damage to the TFT is reduced or prevented by the dummy capacitor DC, and damage to the additional transistor TR1 and the storage capacitor STR is reduced or prevented.

FIGS. 9A through 15 are views illustrating a method of manufacturing an organic light-emitting display apparatus, according to an embodiment of the present invention. Example materials for each of the elements may be as those described in the above embodiments in addition to any examples provided below. Further, for ease of description, reference numerals and descriptors as provided above for the embodiments of FIGS. 3-5 above are used below, but the present invention is not limited thereto.

Figure 9A:
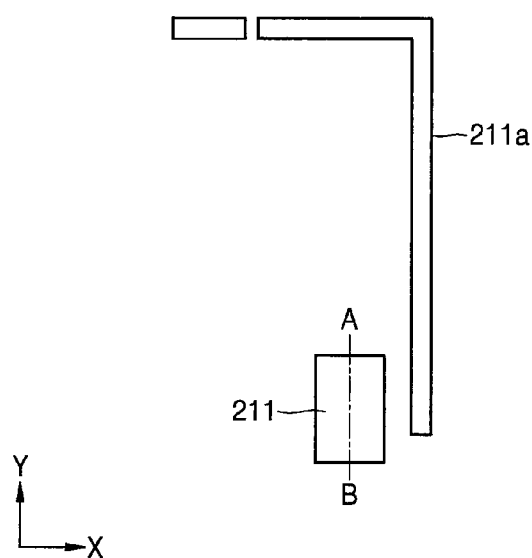
FIGS. 9A through 15 are views illustrating a method of manufacturing an organic light-emitting display apparatus, according to an embodiment of the present invention.
Figure 9B:
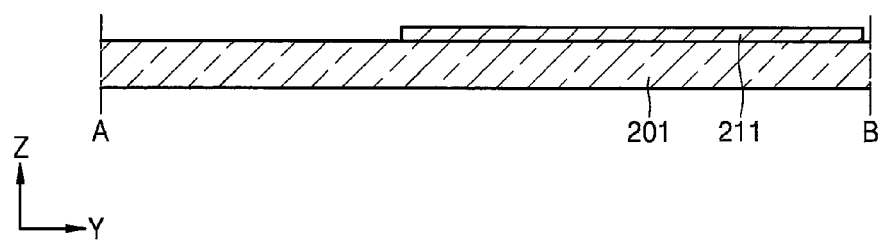

Referring to FIGS. 9A and 9B, the active layer 211 is formed on the substrate 201. Here, by using a material for forming the active layer 211, a lower terminal 211a of a storage capacitor STR may be formed together with the active layer 211. FIG. 9B is a cross-sectional view taken along line A-B of FIG. 9A.

Figure 10A:
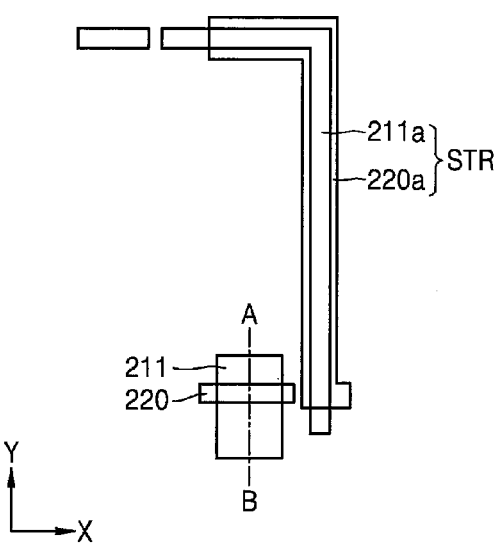
Figure 10B:
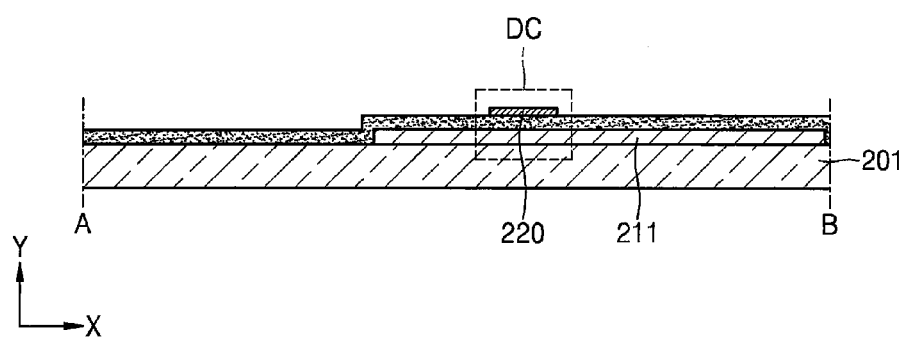

Referring to FIGS. 10A and 10B, the gate insulating layer 212 is formed above the active layer 211. The dummy conductive pattern 220 is formed on the gate insulating layer 212. FIG. 10B is a cross-sectional view taken along line A-B of FIG. 10A.

Here, by using a material for forming the dummy conductive pattern 220, an upper terminal 220a of the storage capacitor STR may be formed together with the dummy conductive pattern 220, thereby forming the storage capacitor STR. The dummy conductive pattern 220 and a region (a dummy region) of the active layer 211, which overlaps with the dummy conductive pattern 220, form the dummy capacitor DC.

Figure 11A:
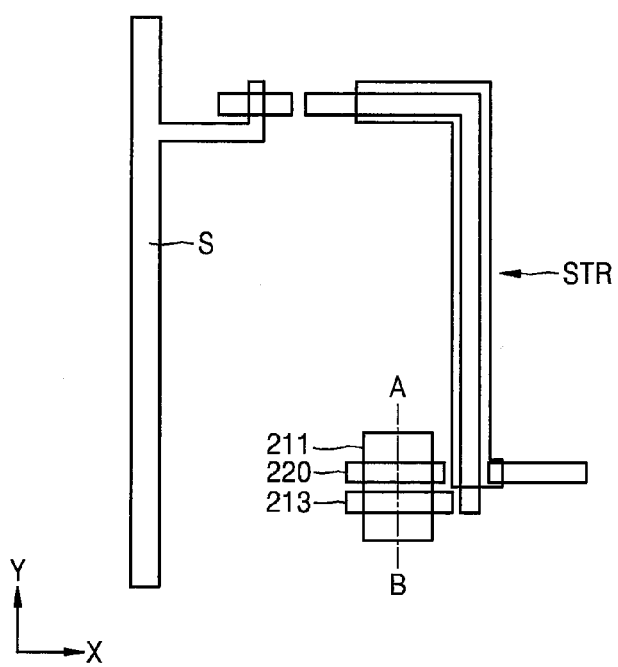
Figure 11B:
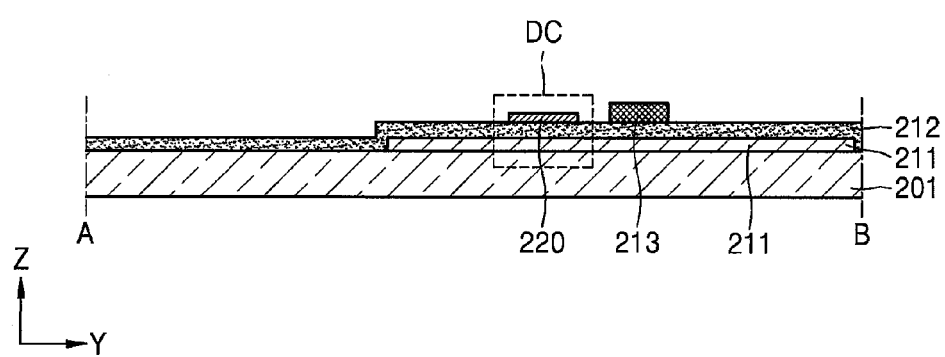

Referring to FIGS. 11A and 11B, the gate electrode 213 is formed on the gate insulating layer 212 to correspond to a set or predetermined region (a gate region) of the active layer 211. FIG. 11B is a cross-sectional view taken along line A-B of FIG. 11A.

The gate electrode 213 is spaced apart from the dummy conductive pattern 220. In addition, the gate electrode 213 is formed in the same layer and of the same material as the scan line S. Here, the scan line S extends to form (or is otherwise connected to) a gate electrode of an additional transistor TR1. After forming the gate electrode 213, an ion injection process may be performed according to another embodiment of the present invention. That is, n-type impurities or p-type impurities may be injected into the active layer 211.

Figure 12A:
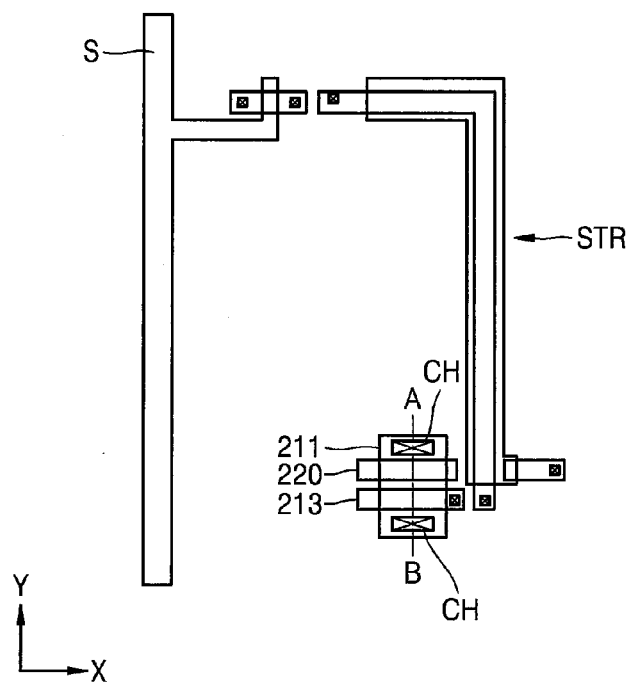
Figure 12B:
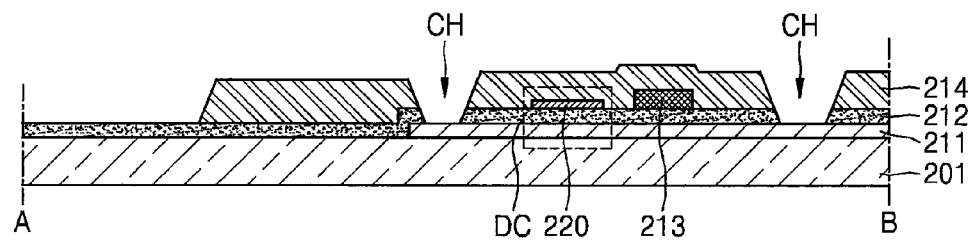

Referring to FIGS. 12A and 12B, the interlayer insulating layer 214 is formed on and covers the gate electrode 213 and the dummy conductive pattern 220. FIG. 12B is a cross-sectional view taken along line A-B of FIG. 12A.

Set or predetermined contact holes CH are formed in the interlayer insulating layer 214 and the gate insulating layer 212 to expose set or predetermined regions (source and drain regions) of the active layer 211. In addition, the interlayer insulating layer 214 is patterned to expose a set or predetermined region of the gate insulating layer 212 (for example, as illustrated in FIG. 12 left).

Figure 13A:
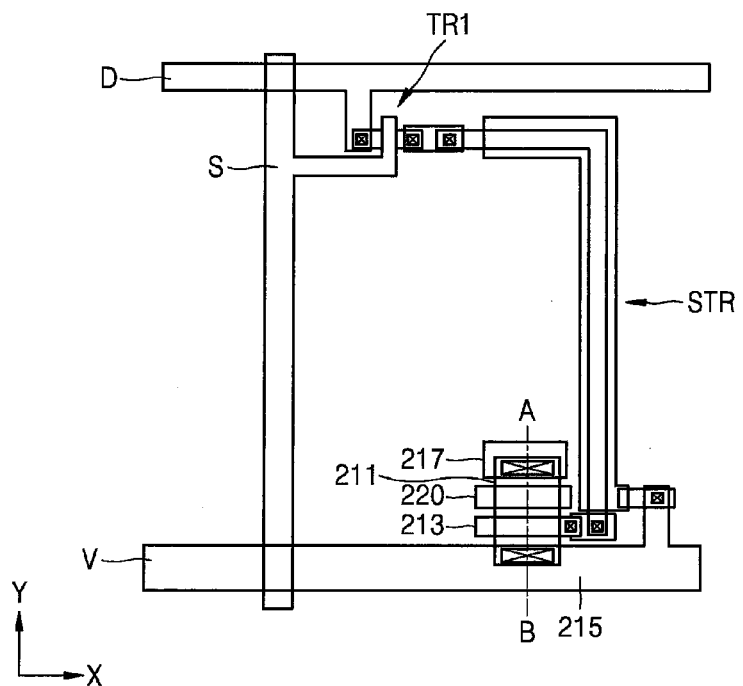
Figure 13B:
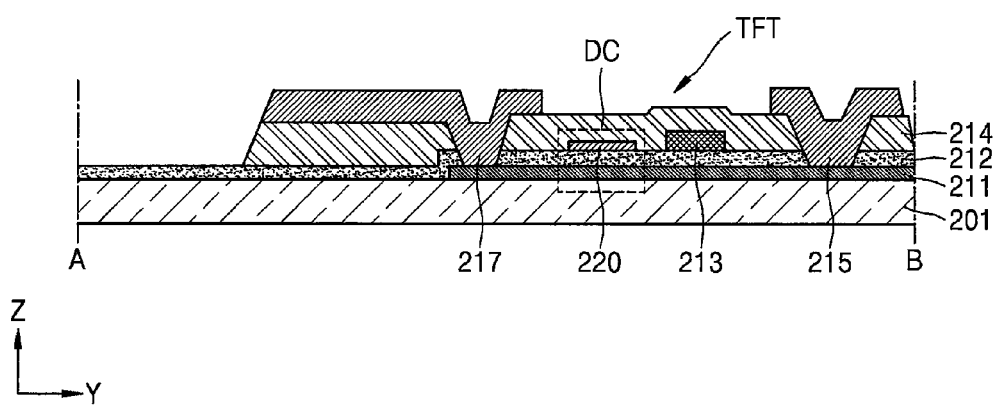

Referring to FIGS. 13A and 13B, the source electrode 215 and the drain electrode 217 are formed on the interlayer insulating layer 214. FIG. 13B is a cross-sectional view taken along line A-B of FIG. 13A. The source electrode 215 and the drain electrode 217 are formed to correspond to the above-described contact holes CH so that the source electrode 215 and the drain electrode 217 are connected to set or predetermined regions (source and drain regions, respectively) of the active layer 211.

The data line D and the power supply line V are formed in the same layer and of the same material as the source electrode 215 and the drain electrode 217 (for example, concurrently or simultaneously with the source electrode 215 and the drain electrode 217). The source electrode 215 and the drain electrode 217 do not overlap the dummy conductive pattern 220.

Figure 14A:
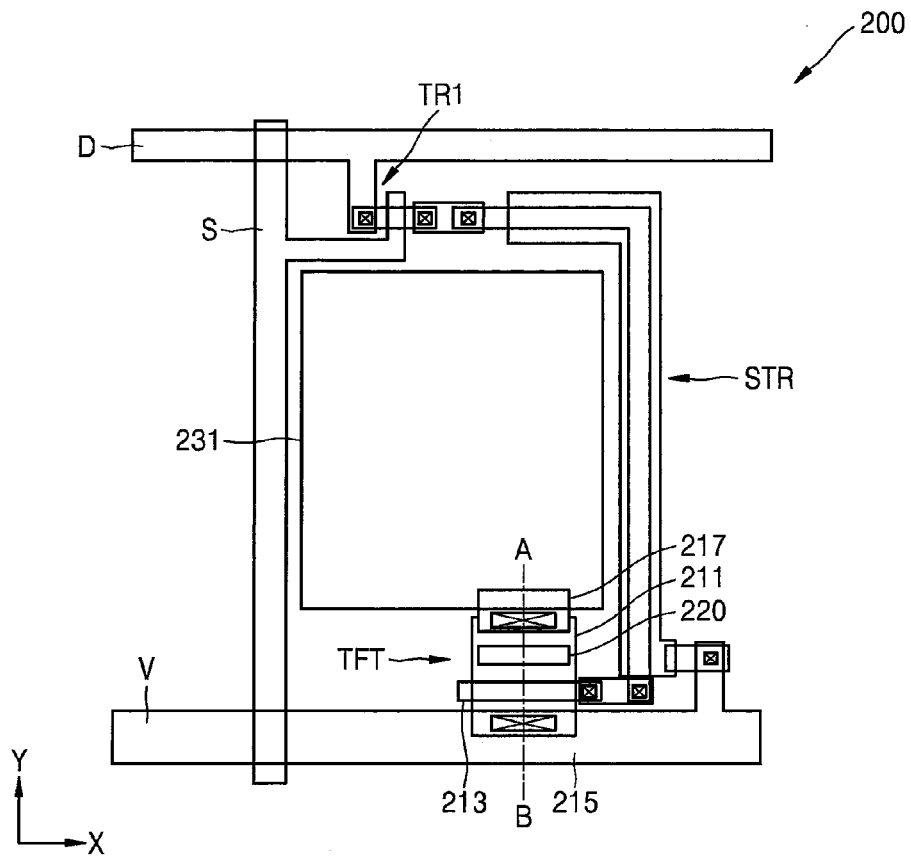
Figure 14B:
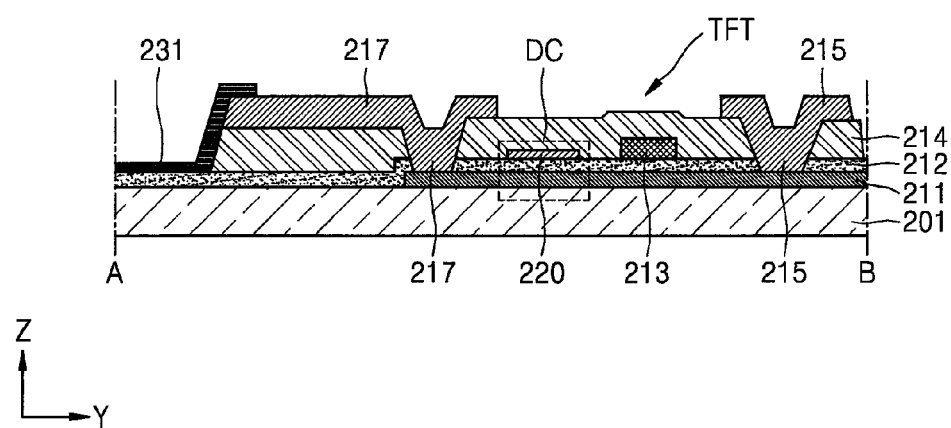

Referring to FIGS. 14A and 14B, the first electrode 231 is formed to be electrically connected to the drain electrode 217 (for example, corresponding to the exposed portion of the gate insulating layer 212). FIG. 14B is a cross-sectional view taken along line A-B of FIG. 14A. In another embodiment, the first electrode 231 may be formed to be connected to the source electrode 215.

In further detail, the first electrode 231 may be formed on the gate insulating layer 212. That is, the first electrode 231 may be formed on the exposed portion of the gate insulating layer 212 (that is not covered by the interlayer insulating layer 214).

Figure 15:
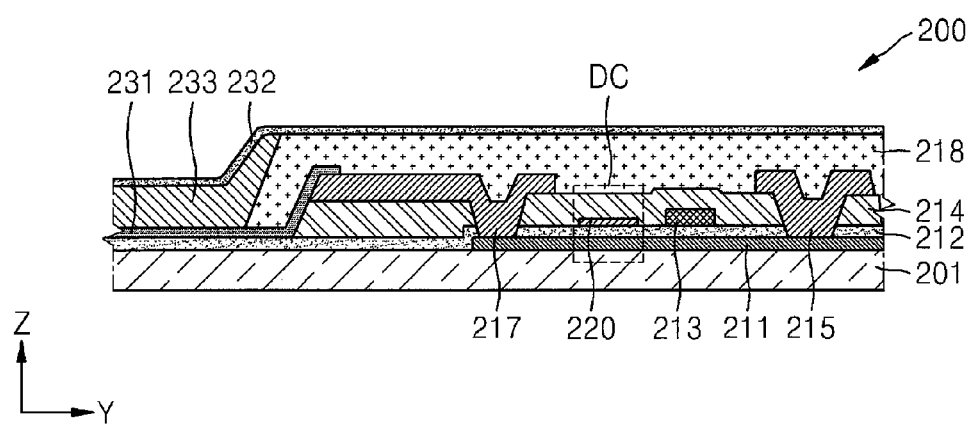

Referring to FIG. 15, the pixel-defining layer 218 is formed on the first electrode 231 such that a set or predetermined region of the first electrode 231 is exposed. The intermediate layer 233 is formed on the exposed portion of the first electrode 231. In addition, the second electrode 232 is formed on the intermediate layer 233. An encapsulating member may be formed on the second electrode 232.

The above method of manufacturing an organic light-emitting display apparatus is a method of manufacturing the organic light-emitting display apparatus 200 of FIG. 3 through FIG. 5. However, the present invention is not limited thereto, and in other embodiments, similar methods to the above method may apply to the organic light-emitting display apparatus 100 of FIG. 1 and FIG. 2 or to the organic light-emitting display apparatus 300 of FIG. 6 through FIG. 8.

The organic light-emitting display apparatus 200 includes the dummy conductive pattern 220. The dummy conductive pattern 220 overlaps a set or predetermined region (dummy region) of the active layer 211, thereby forming the dummy capacitor DC.

Accordingly, when an influx of external static electricity enters through the first electrode 231 of the organic light-emitting display apparatus 200, the static electricity does not flow to the TFT, thereby reducing or preventing damage to the TFT (or to the storage capacitor STR or other transistor TR1). That is, the static electricity flows through the first electrode 231 to the drain electrode 217 and is stored in the dummy capacitor DC. Depending on factors such as the intensity of the static electricity, only the dummy capacitor DC is damaged by the static electricity.

Here, the dummy conductive pattern 220 is formed in an island pattern, is spaced apart from the gate electrode 213, and is not connected to the source electrode 215 or the drain electrode 217. Accordingly, the dummy conductive pattern 220 and the dummy capacitor DC, including the dummy conductive pattern 220, are prevented from electrically affecting (or having a significant electrical effect on) the TFT.

In addition, the dummy conductive pattern 220 does not overlap the source electrode 215 or the drain electrode 217, thereby reducing or preventing parasitic capacitance from occurring between the dummy conductive pattern 220 and the source or drain electrodes 215 or 217. Further, when the dummy conductive pattern 220 is formed, the dummy conductive pattern 220 may be formed concurrently (for example, simultaneously) with the upper terminal 220a of the storage capacitor STR to improve ease of manufacture.

As described above, according to one or more embodiments of the present invention, electrical characteristics and image quality of an organic light-emitting display apparatus may be further improved. It should be understood that the example embodiments described herein should be considered in a descriptive sense only and not for purposes of limitation. Descriptions of features or aspects within each embodiment should generally be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims, and their equivalents.

What is claimed is:

1. An organic light-emitting display apparatus comprising:
   a substrate;
   a thin film transistor (TFT) on the substrate and comprising an active layer, a gate electrode overlapping a gate region of the active layer, a source electrode overlapping a source region of the active layer, and a drain electrode overlapping a drain region of the active layer;
   a first electrode electrically connected to one of the source electrode or the drain electrode;
   a first dummy conductive pattern overlapping a dummy region of the active layer between the gate region and one of the source region or the drain region corresponding to the one of the source electrode or the drain electrode;
   an intermediate layer on the first electrode and comprising at least an organic emission layer; and
   a second electrode on the intermediate layer.

2. The organic light-emitting display apparatus of claim 1, wherein the first dummy conductive pattern and the dummy region form a dummy capacitor.

3. The organic light-emitting display apparatus of claim 1, wherein the first dummy conductive pattern is separated from the gate electrode.

4. The organic light-emitting display apparatus of claim 1, wherein the first dummy conductive pattern is separated from the source electrode and the drain electrode.

5. The organic light-emitting display apparatus of claim 1, wherein the first dummy conductive pattern does not overlap the source electrode or the drain electrode.

6. The organic light-emitting display apparatus of claim 1, wherein the first dummy conductive pattern is an island pattern.

7. The organic light-emitting display apparatus of claim 1, wherein the first electrode comprises a same material and is in a same layer as the gate electrode.

8. The organic light-emitting display apparatus of claim 1, further comprising a gate insulating layer between the active layer and the gate electrode, wherein the first electrode is on the gate insulating layer.

9. The organic light-emitting display apparatus of claim 1, further comprising a storage capacitor electrically connected to the TFT, wherein the first dummy conductive patter comprises a same material and is in a same layer as a first terminal of the storage capacitor.

10. The organic light-emitting display apparatus of claim 9, wherein the active layer comprises a same material and is in a same layer as a second terminal of the storage capacitor.

11. The organic light-emitting display apparatus of claim 1, further comprising a second dummy conductive patter overlapping the first dummy conductive pattern.

12. The organic light-emitting display apparatus of claim 11, wherein the second dummy conductive pattern is separated from the source electrode and the drain electrode.

13. The organic light-emitting display apparatus of claim 11, wherein the second dummy conductive pattern is an island pattern.

14. The organic light-emitting display apparatus of claim 11, wherein the second dummy conductive pattern comprises a same material and is in a layer as the source electrode or the drain electrode.

15. The organic light-emitting display apparatus of claim 1, wherein the first dummy conductive pattern comprises a light-transmitting conductive material.

16. A method of manufacturing an organic light-emitting display apparatus, the method comprising:
    forming a thin film transistor (TFT) comprising an active layer, a gate electrode overlapping a gate region of the active layer, a source electrode overlapping a source region of the active layer, and a drain electrode overlapping a drain region of the active layer on a substrate;
    forming a first electrode electrically connected to one of the source electrode or the drain electrode;
    forming a first dummy conductive pattern overlapping a dummy region of the active layer between the gate region and one of the source region or the drain region corresponding to the one of the source electrode or the drain electrode;
    forming an intermediate layer on the first electrode and comprising at least an organic emission layer; and
    forming a second electrode on the intermediate layer.

17. The method of claim 16, further comprising forming a storage capacitor electrically connected to the TFT, wherein the first dummy conductive pattern comprises a same material and is in a same layer as a terminal of the storage capacitor.

18. The method of claim 16, further comprising forming a second dummy conductive pattern overlapping the first dummy conductive pattern.

19. The method of claim 18, wherein the second dummy conductive pattern comprises a same material and is in a same layer as the source electrode or the drain electrode.

20. The method of claim 18, wherein the second dummy conductive pattern is separated from the source electrode and the drain electrode.

* * * * *